US010156618B2

(12) United States Patent
Van Leeuwen (10) Patent No.: US 10,156,618 B2
(45) Date of Patent: Dec. 18, 2018

(54) RESONANT TRAP WITH AXIAL CHANNEL

(71) Applicant: KONINKLIJKE PHILIPS N.V., Eindhoven (NL)

(72) Inventor: Laurens Cornelis Van Leeuwen, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 529 days.

(21) Appl. No.: 14/652,977

(22) PCT Filed: Dec. 13, 2013

(86) PCT No.: PCT/IB2013/060929
§ 371 (c)(1),
(2) Date: Jun. 17, 2015

(87) PCT Pub. No.: WO2014/097095
PCT Pub. Date: Jun. 26, 2014

(65) Prior Publication Data
US 2015/0323625 A1    Nov. 12, 2015

Related U.S. Application Data

(60) Provisional application No. 61/739,901, filed on Dec. 20, 2012, provisional application No. 61/774,218, filed on Mar. 7, 2013.

(51) Int. Cl.
*H01P 1/202*  (2006.01)
*G01R 33/36*  (2006.01)

(52) U.S. Cl.
CPC .......... *G01R 33/3685* (2013.01); *H01P 1/202* (2013.01)

(58) Field of Classification Search
CPC .............................. H01P 2/202; G01R 33/3685
See application file for complete search history.

(56) References Cited

U.S. PATENT DOCUMENTS

| 4,730,173 | A | * | 3/1988 | Tsunoda | H01P 1/202 333/206 |
|---|---|---|---|---|---|
| 5,321,374 | A | | 6/1994 | Uwano | |
| 6,662,760 | B1 | | 12/2003 | Stanglmaier et al. | |
| 6,727,698 | B1 | | 4/2004 | Eydelman | |
| 7,357,839 | B2 | | 4/2008 | Takano et al. | |
| 7,960,812 | B2 | * | 6/2011 | Carberry | H01C 10/12 257/532 |
| 2005/0231300 | A1 | | 10/2005 | Greim et al. | |
| 2007/0026733 | A1 | | 2/2007 | Greim et al. | |
| 2010/0148775 | A1 | | 6/2010 | Greim | |
| 2011/0140700 | A1 | | 6/2011 | Taracila et al. | |

FOREIGN PATENT DOCUMENTS

| JP | 04121101 A | 4/1992 |
|---|---|---|
| JP | 2011172647 | 9/2011 |
| WO | 03025608 A2 | 3/2003 |

* cited by examiner

*Primary Examiner* — Robert J Pascal
*Assistant Examiner* — Kimberly E Glenn (57) ABSTRACT

A resonant trap includes a hollow cylindrical body its interior forming an axial channel. An inner conductor is provided on the hollow cylindrical body's inner wall and an outer conductor is provided on the hollow cylindrical body's outer wall. A carrier in the form of a resilient ring or an axial plate is attached to the inner wall of the axial channel and a tuning capacitor mounted to the carrier.

8 Claims, 6 Drawing Sheets

RESONANT TRAP WITH AXIAL CHANNEL

CROSS-REFERENCE TO PRIOR APPLICATIONS

This application is the U.S. National Phase application under 35 U.S.C. § 371 of International Application No. PCT/IB2013/060929, filed on Dec. 13, 2013, which claims the benefit of U.S. Patent Application No. 61/739,901, filed on Dec. 20, 2012 and 61/774,218 filed Mar. 7, 2013. These applications are hereby incorporated by reference herein.

FIELD OF THE INVENTION

The invention pertains to a resonant trap, notably for use in a magnetic resonance examination system. The resonant trap has an axial channel through which an electrical lead or cable can be fed. The resonant trap suppresses the unwanted common mode current in the electrical lead or cable which is induced by the electromagnetic coupling along the electrical lead or cable due to, e.g. the RF field generated by the magnetic resonance examination system.

BACKGROUND OF THE INVENTION

Such a resonant trap is known from the international application WO03/025608. The known resonant trap has a cylindrical arrangement with an inner conductor and an outer conductor. Both are connected to each other at the resonant trap's shorted end. The inner conductor covers part of the electrical lead and the outer conductor covers the inner conductor. The known resonant trap has a channel trough which a cable or electrical lead can be fed by simply sliding it through the channel. In particular no galvanic connection is needed between the resonance trap and the cable or electrical lead.

SUMMARY OF THE INVENTION

An object of the invention is to provide a resonant trap that is easy to manufacture.

This object is achieved by a resonant trap according to the invention which comprises a hollow cylindrical body its interior forming an axial channel, and an inner conductor is provided on the hollow cylindrical body's inner wall and an outer conductor is provided on the hollow cylindrical body's outer wall a carrier attached to the inner wall of the axial channel and a tuning capacitor mounted to the carrier.

Together with the electrical inductance and capacitance of the inner and outer conductor, that are electrically conducting, the tuning capacitor achieves that the resonance trap has a resonance frequency at or near the Larmor frequency associated with the main magnetic field of a magnetic resonance examination system. The magnetic resonance examination system can be a magnetic resonance diagnostic imaging or spectroscopy system to acquire magnetic resonance image data or magnetic resonance spectroscopy data from a patient to be examined. The tuning capacitor in combination with the electro-magnetic configuration of the inner and outer conductors forms a resonant structure having a resonance bandwidth around the Larmor frequency. The tuning capacitors increase the effective electrical length of the resonant trap. Hence, a relatively short physical length is needed to achieve an effective electrical length of about ¼ wavelength at the Larmor frequency. Thus, the resonant trap needs only a small space. The carrier is easily mechanically connected to the inner wall. The tuning capacitor is easily connected to the carrier. Notably, independent mechanical and/or electrical connections are employed between the inner wall and the carrier and between the carrier and the tuning capacitor. Thus, the tuning capacitor can be connected to the carrier without risk that the carrier is released from the inner wall. This makes it easy to achieve an electrical connection between the tuning capacitor and the outer wall while the tuning capacitor is held in position on the carrier that is mechanically connected to the inner wall. In particular, soldering the tuning capacitor to the electrical connection can be done without risk of damage to an already soldered connection of the electrical connection to the outer wall. It appears that the resonant trap of the invention has improved operational life time and improved reliability, notably because the resonant trap is less susceptible to damage due to-temperature changes.

The resonant trap acts to reduce the common mode current through the electrical lead or through the jacket of the cable that is fed through the axial channel of the resonant trap.

These and other aspects of the invention will be further elaborated with reference to the embodiments defined in the dependent Claims.

According to an aspect of the invention, the carrier is formed by a resilient ring that is clamped in the axial channel at (one of) its open end(s). The clamped ring provides a stable support onto which the tuning capacitors can be easily mounted. Further the ring is simply clamped into the axial channel which does not involve complicated manufacturing steps. In a related aspect of the invention, one or more axially extending protrusions are provided on the resilient ring. The tuning capacitor is mounted on one of these protrusions. Several tuning capacitors can be provided, each of them mounted on one of the protrusions.

The resilient ring forming the carrier remains fixedly in position when the tuning capacitor is soldered to the protrusion extending from the resilient ring. Also when the resilient ring is soldered to the conductor on the inner wall the resilient ring remains clamped in position. Further, the electrical connection between the tuning capacitor and the outer conductor is made. This electrical connection is formed by the electrically conducting strip that is soldered to (one of the contacts of) the tuning capacitor and the outer conductor. The carrier in the form of the resilient ring remains fixedly in position during these solderings. This further provides more freedom to chose melting points of the respective solders without risk that already soldered connections may become detached. All components remain stable in position because the resilient ring is clamped in position.

According to another aspect of the invention the carrier is formed by an axial plate. In this embodiment of the invention a radial access or opening is provided through the axial channel's inner wall. The radial access extends through the outer conductor, the wall of the hollow cylindrical body and the inner conductor. The axial plate is attached to the cylindrical hollow body in the axial channel near the radial access. Notably, the axial plate is mounted to the axial channel's inner wall so that the axial plate extends over the radial access where the radial access meets the axial channel. For example, the axial plate is attached to the inner conductor of the cylindrical body. The tuning capacitor is then mounted onto the axial plate and is lodged inside the radial access. It is simple to attach the axial plate inside the axial channel near the radial access. Moreover, it is simple to mount the tuning capacitor on the axial plate so that the tuning capacitor is lodged in the radial access.

According to a further aspect of the invention the tuning capacitor is electrically connected to the outer wall of the hollow cylindrical body. This electrical connection is achieved by an electrically conducting (metal) strip that extends between the tuning capacitor and the outer wall. More in particular, the metal strip is in contact to one electrical terminal of the tuning capacitor and to the outer conductor on the outer wall of the hollow cylindrical body. For example when a surface mounted technology (SMT) capacitor is used, the electrical terminal(s) are formed by the termination(s) of the SMT capacitor. According to this aspect of the invention, the length of the metal strip, notably the length of the metal strip that is in contact with the outer conductor, is the minimum length required for a pre-determined adhesion of the electrically conducting strip to the outer conductor. This minimum length can be experimentally determined by way of so-called highly-accelerated life time (HALT) testing that is performed in a climate room. Thus, fixation of the electrically conducting strip is optimised with respect to the length that is sufficiently large to achieve good mechanical attachment and that is sufficiently short to withstand the severe thermal cycles. This minimum length ensures sufficient mechanical adhesion between the electrically conducting strip and the outer conductor. An insight of this aspect of the invention is that when the electrically conducting strip is longer than this minimum length for sufficient adhesion, then the connection between the electrically conducting strip and the outer conductor becomes susceptible to damage due to thermal expansion of the electrically conducting strip. The thermal expansion of several of the capacitors' electrical conducting strips expand in the same direction and simultaneously, thermal expansion create as less as possible mechanical stress on the solder joints. In a similar manner by way of such an electrically conducting strip the tuning capacitor can be connected to the inner conductor.

The carrier can be soldered to the inner conductor that is disposed on the inner wall of the hollow cylindrical body. Next, the tuning capacitor, notably with one of its electrical terminals is soldered to the carrier.

The axial plate forming the carrier is soldered to the inner conductor on the inner wall using a solder having a high melting point. Suitable solders are for example $Sn_{62}Pb_{36}Ag_2$ or $Sn_{10}Pb_{88}Ag_2$. Separate from the hollow cylindrical body, the electrically conducting strip is soldered to one electrical terminal of the tuning capacitor also using a solder having a high melting point. Subsequently, the tuning capacitor with the electrically conducting strip is mounted onto the axial plate. Thus, the capacitor is lodged in the radial recess soldered to the axial plate. The electrically conducting strip then extends from the radial recess over the outer conductor and can be simply soldered to the outer conductor. Notably solders with a lower melting point are employed to solder the capacitor onto the axial plate and to solder the electrically conducting strip to the outer conductor. In this way, subsequent solderings cannot detach previously soldered contacts because these previously soldered contacts have a higher melting point than the subsequently soldered contacts. The axial expansion, as a result of temperature changes, of the axial plate and the electrically conducting strip are in the same direction, causing no mechanical stress on the solder joints. Thus use is made of only one solder joint on the inner conductor and only one solder joint on the outer conductor. The positioning of the solder joints allows the capacitor to move freely as result of temperature changes.

According to yet another aspect of the invention tangentially extending isolating slits are provided in the outer conductor. These slits influence the electrical inductance and the resonant frequency of the resonant trap. Providing these slits can simply be done by scratching the slits through the outer conductor. For example, the slits can be provided while measuring the electrical inductance or the resonance frequency of the resonant trap. This measurement is performed during manufacture of the resonant trap. This achieves accurate tuning to resonance of the resonant trap and a highly reliable construction without the need for complicated manufacturing steps. In this way manufacturing yield of good quality resonant traps is increased. Notably, at an electrically closed end of the hollow cylindrical body the inner conductor and the outer conductor are electrically connected by a short. That is, an electrically conducting connection is disposed between the inner conductor and outer conductor at the electrically closed, i.e. electrically shorted end of the hollow cylindrical body.

The inner conductor and the outer conductor are electrically separated at an open end of the hollow cylindrical body. An insight of this aspect of the invention is that the electrical inductance and resonance frequency of the resonant trap is only weakly sensitive to the length of the isolating slits near the open end. The electrical inductance of the resonant trap is much more sensitive to the length of the isolating slits as the isolating slits are located near the electrically closed end. Consequently, applying the isolating slits near the open end allows an easy way to achieve the length of the isolating slits to accurately adjust the resonance frequency of the resonant trap during manufacture. The isolating slits near the open end, because of their relatively weak effect on the electrical inductacne and resonance frequency, further appear to reduce sensitivity for damage to the outer conductor during the operational life time of the resonant trap.

According to a further aspect of the invention, the inner and outer conductor are formed by a continuous electrically conducting layer, i.e. a plating, extending over the electrically shorted, i.e. over the electrically closed end of the hollow cylindrical body. The continuous electrically conducting layer is shaped around rounded edges of the hollow cylindrical body of the trap, that is made of a dielectric material, between the short and the inner and outer conductors. For example, the rounded edges of the continuous electrically conducting layer are formed by disposing the electrically conducting layer over rounded edges of the cylindrical hollow body. These rounded edges achieve good adhesion of the electrically conducting layer onto the hollow cylindrical body. For example, the hollow cylindrical body is made of a dielectric material, e.g. a ceramic material and the electrically conducting layer is for example a silver, copper or aluminium layer. Moreover, the adhesion of the electrically conducting layer (plating) to the hollow cylindrical body is mechanically stronger when the edges are rounded; very good results are achieved when the edges have a radius of curvature of at least about 1 mm. The maximum radius of curvature is determined by the thickness of the wall of the hollow cylindrical body and in practice the maximum radius is about half the thickness of the wall. In a practical example the wall thickness is about 6 mm and the radius of curvature of the rounded edge is between 1 mm and 3 mm.

According to another aspect of the invention in which the tuning capacitor is mounted in the radial access on the axial plate, an electrically isolating zone is provided between the outer conductor and the inner conductor at the electrically open end of the hollow cylindrical body. This is achieved in that at the electrically open end, the inner conductor is longer than outer conductor. This electrically isolating zone is formed in that the outer conductor over the outer wall does not extend all the way up to the electrically open end. This electrically isolating zone extends tangentially over the hollow cylindrical body's outer wall and longitudinally between the outer conductor and the electrically end. Preferably, the inner conductor extends fully to the physical end of the inside. This electrically isolating zone reduces sensitivity of the resonance frequency of the resonant trap on the load of the cable or electrical lead fed through the axial channel.

BRIEF DESCRIPTION OF THE DRAWINGS

These and other aspects of the invention will be elucidated with reference to the embodiments described hereinafter and with reference to the accompanying drawing wherein.

DETAILED DESCRIPTION OF THE EMBODIMENTS

Figure 1:
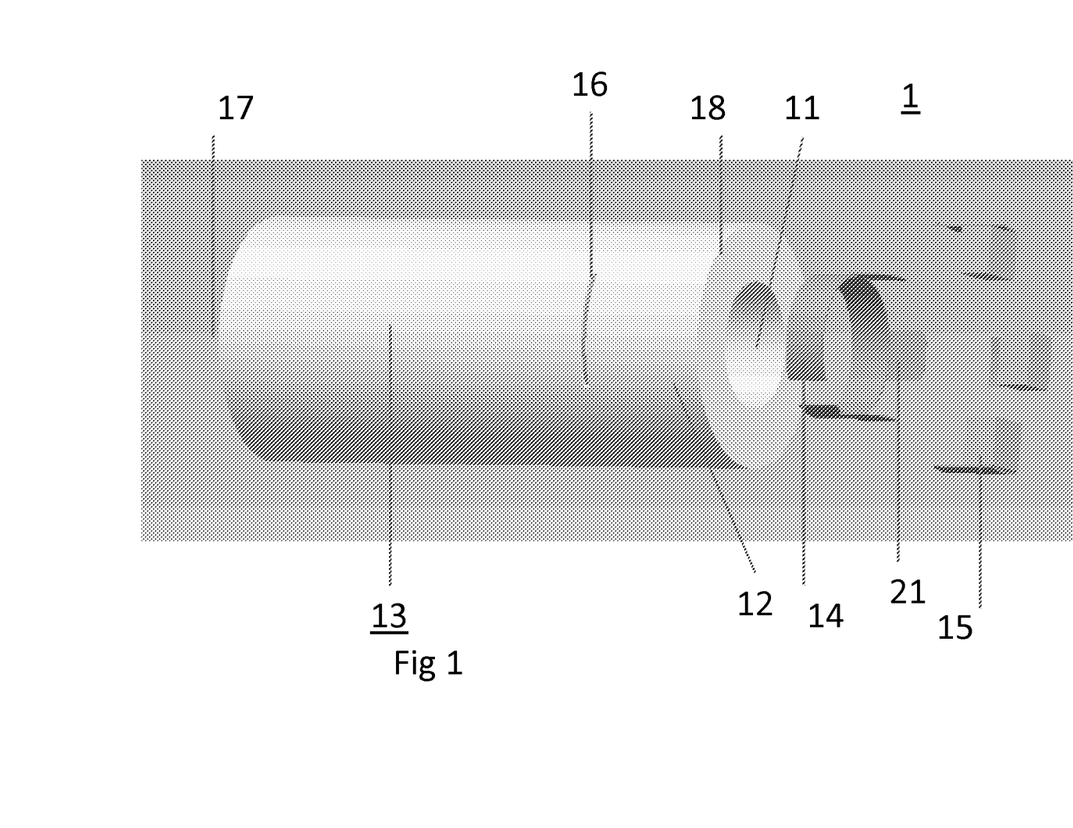
FIG. 1 shows an exploded view of an embodiment of the resonant trap of the invention.

FIG. 1 shows an exploded view of an embodiment of the resonant trap of the invention. The resonant trap 1 comprises the hollow cylindrical body 13. The interior of the hollow cylindrical body forms the axial channel 11. Through the axial channel a cable (not shown) to be trapped can be slid. On the outer wall of the hollow cylindrical body the outer conductor 12 is disposed and on the inner wall (i.e. the wall of the axial channel 11) the inner conductor is disposed. The carrier 14 onto which the tuning capacitor(s) is (are) mounted has the form of the resilient ring that is clamped in the axial channel at the channel entrance. The resilient ring 14 has protrusions 21 onto which the tuning capacitors can be mounted. Each of the tuning capacitors is electrically connected at one of its electrical terminals to the outer conductor with an electrically conducting strip 33. At the electrically closed end 17 of the resonant trap, the inner conductor and the outer conductor are electrically connected (not visible in the drawing). At the electrically open end 18 of the resonant trap the inner conductor is separated, i.e. electrically isolated from the outer conductor.

Figure 2:
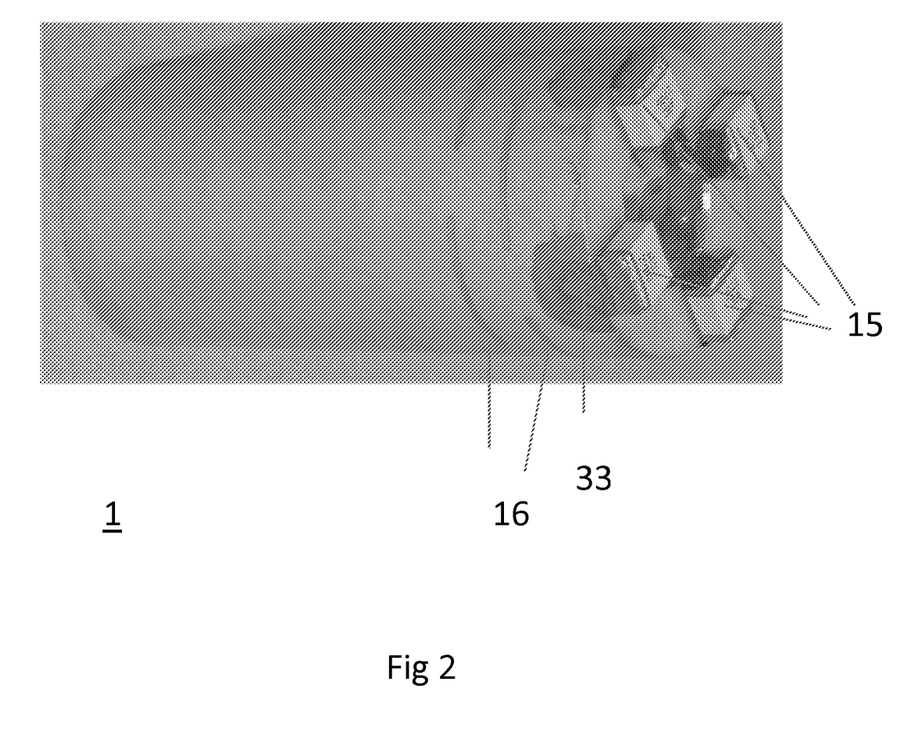
FIG. 2 shows the embodiment of the resonant trap of FIG. 1 with the tuning capacitors mounted in position.

As can be seen in FIG. 1 the resilient ring in the form of spring, with a C-shape, and two three, four or more stubs that form the protrusions, is used for mounting of the capacitors. The advantage of this C-shaped spring is that it keeps itself positioned when it is pushed in the inside of the ceramic tube. This is important for the soldering process. First the ring must be soldered to the silver plating on the inside, next a capacitor must be soldered to the stubs. For this last soldering action the stubs must be heated till above the melting point of the solder, simultaneously the C-shaped ring must remain fixed on its place on the inside while locally the solder joint on the inside could melt. So the spring function of the C-shaped ring keeps the ring in position during the soldering actions. Normally this is done by two different solders, so with two different melting points. The third solder joint, connecting electrically conducting strip 33 to the capacitor, makes use of a high melting point solder. The last solder joint is the connection of the electrically conducting strip 33 to the plating of the outside of the tube. This is again the lower melting point solder. Using solders with different melting temperatures is not difficult to realize. The solder joints determine strongly the life time and reliability of these traps. A crack in the solder joint causes immediately malfunctioning of the trap. Because the carrier, e.g. the C-shaped ring is kept in position, cracks in the solder are avoided FIG. 2 shows the embodiment of the resonant trap of FIG. 1 with the tuning capacitors 15 mounted in position. Here an embodiment with four tuning capacitors is shown. In FIG. 2 also several slits to influence the electrical inductance of the resonant trap as provided near the electrically open end are shown. Again, the slits are provided near the electrically open end 18 of the resonant trap. In this region it is easy to accurately adjust the size, notably the length, of the slits to accurately adjust the resonant frequency of the resonant trap.

The slits are positioned in an area close to the open end. The advantage is that this area is less sensitive for slitting than an area close to the electrically shorted end of the resonant trap, this results in less sensitivity for damage on the edges of the slits. Another advantage is that, during normal operation, close to the open end, less current is running than near the electrically shorted end, which reduces unwanted electromagnetic coupling via H-fields. Although the area near the open end is less sensitive, the slitting pattern has a sufficiently large tuning range. That means the difference between no slitting and maximum allowed slitting (70% of the total circumference and maximum two layers) results in a sufficient frequency difference to compensate for all frequency shifting production inaccuracies.

Figure 3:
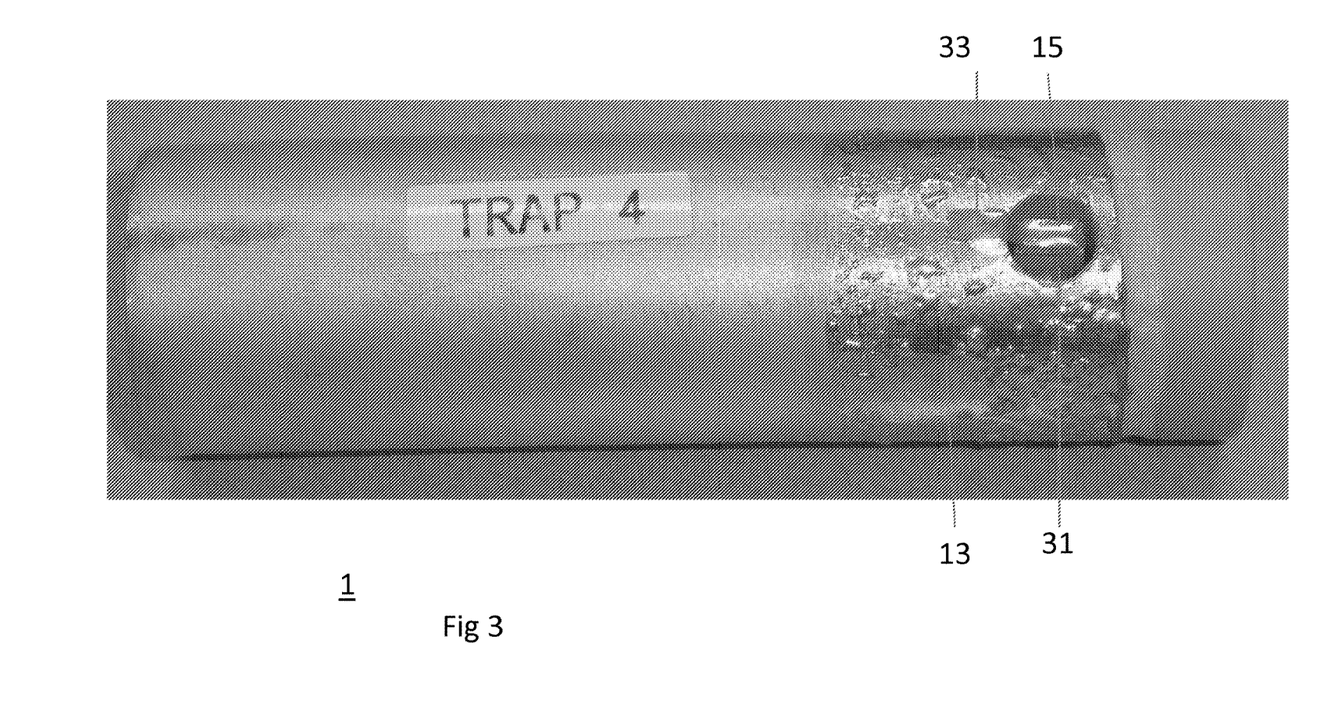
FIG. 3 shows another embodiment of the resonant trap of the invention that has a radial access.

FIG. 3 shows another embodiment of the resonant trap of the invention that has a radial access 31. In this embodiment the tuning capacitor 15 is lodged in the radial access 31. The tuning capacitor 15 is electrically connected to the outer conductor with the electrically conducting strip 33. The thermal expansion coefficient of silver, solder and ceramics are different. The longer the soldering distance SD from FIGS. 2 and 3, the larger the expansion difference. It appears from intensive HALT testing (Highly Accelerated Life Time Tests) that approximately 5 mm is long enough for good adhesion (600 grf/mm2), and short enough for not creating destroying forces on the solder joint as result of thermal expansion difference. A longer strip showed, during the life time tests, cracks and disconnection from the silver plating.

Figure 4:
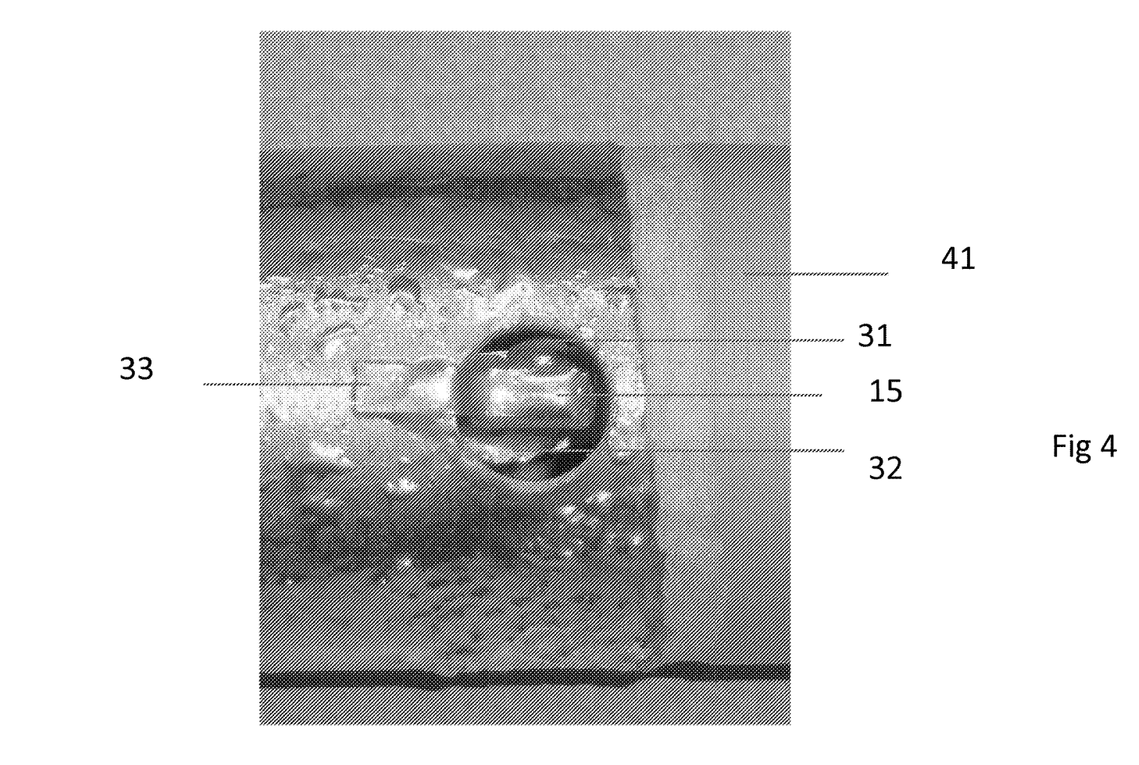
FIG. 4 shows a close up of the resonant trap of FIG. 3 showing the tuning capacitor mounted in the radial access.

FIG. 4 shows a close up of the resonant trap of FIG. 3 showing the tuning capacitor mounted in the radial access. In the close up of FIG. 4 also the axial plate 32 is shown onto which the tuning capacitor 15 is mounted in the radial access 31. In FIGS. 3 and 4 also the isolating zone 41 between the outer conductor 13 and the open end of the resonant trap is shown. The isolating zone is formed in that the outer conductor does not extend all the way up to the end of the hollow cylindrical body that is made of dielectric material. The nonmagnetic plating is performed by a dipping process. The complete trap is dipped in a silver bath leaving one end not dipped over a short distance. This way one end, the electrically shorted end, is covered by the plating, the other end, that is not completely pushed down in the liquid bath, remains electrically open. To make this kind of silver plated tubes results often in sharp edges. Silver plating cannot attach to a sharp edge. Especially the electrically shorted end is sensitive. If the plating detaches at the electrically shorted end an unacceptable frequency change will be the result. Two edges of each 45 degree is often proposed but this doubles the problems. An edge of 45 degrees is still sharp. The shorted end can only be plated if this end has rounded edges, a curvature radius of about 1 mm provides good results.

The edges at the open end must also be rounded, for another reason. Sharp edges are weak. Ceramic is brittle. If small chips of ceramic material are pushed off from the open end also a frequency change will occur, because the open end acts as a capacitor that is part of this resonant system, and the capacitance of this capacitor is changed due to removing dielectric material.

As can be seen in FIG. 4, the silver plating on the inside is closer to the open end than the silver plating on the outside. This way the resonance frequency of the trap is not sensitive for the thickness of the cable. The ceramic traps are always mounted around a cable for application in an MRI system. In view of type number reduction of ceramic traps, different thicknesses of cables should be allowed to be used in one resonant trap type. If the plating lengths on the inside and the outside were both equal, the resonance frequency of the trap is affected by the cable thickness, which is avoid in the resonant trap of the invention.

Figure 5:
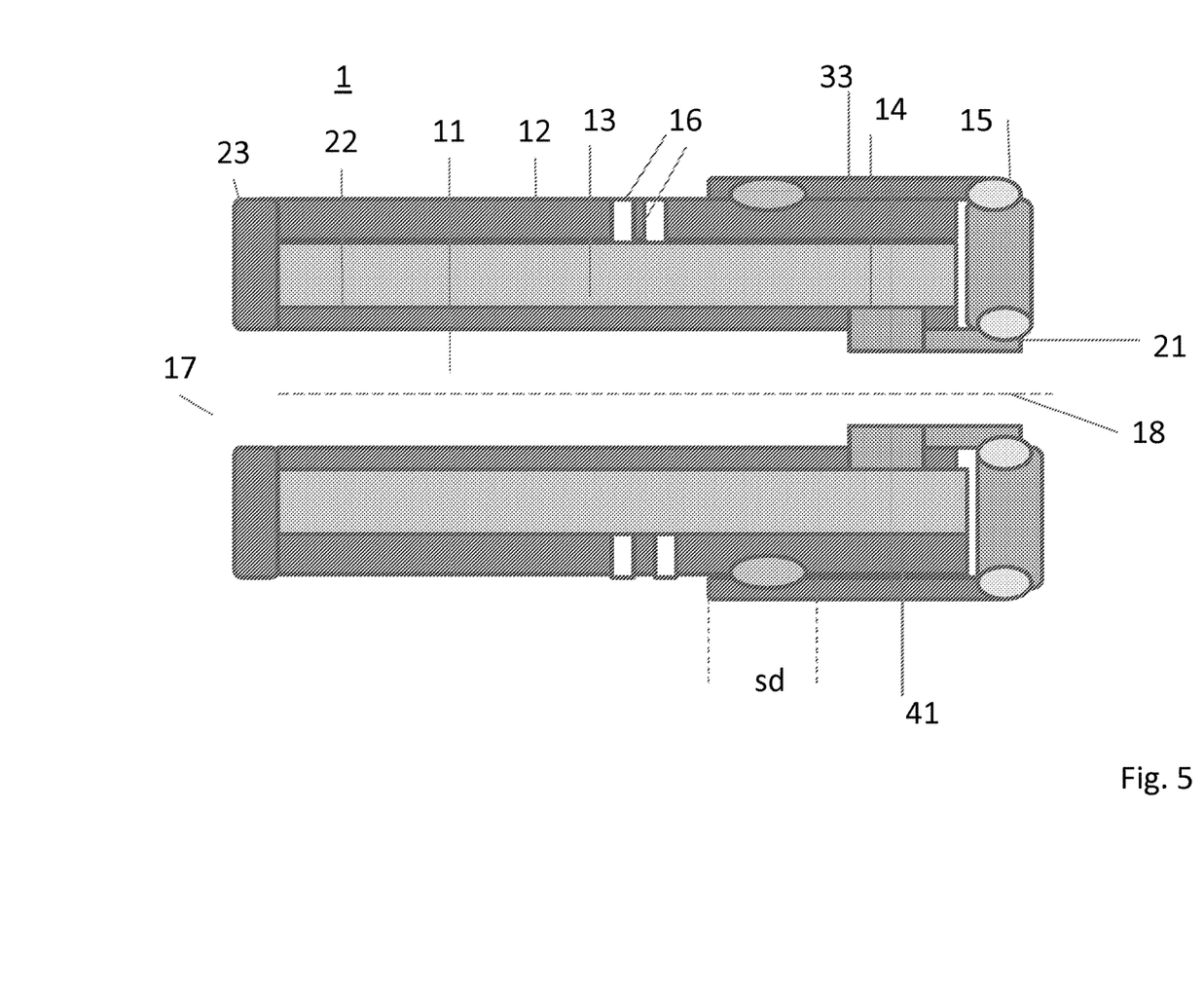
FIG. 5 shows a schematic cross section of the resonant trap of the invention of FIGS. 1 and 2 and FIG. 6 shows a schematic cross section of the resonant trap of the invention in FIG. 3.

FIG. 5 shows a schematic cross section of the resonant trap 1 of the invention of FIGS. 1 and 2. The cross section is along a plane parallel to the longitudinal axis 18. The body of the resonant trap is cylindrically symmetric about the longitudinal axis 18 and the interior forms the axial channel 11. The body 13 is made of a ceramic dielectric material. The outer conductor 12 is disposed on the cylindrical body 13 as a metallic plating. The inner conductor 22 is disposed on the inner wall of the body, i.e. on the wall of the axial channel. At the electrically closed end 17 of the trap 1 the inner conductor 22 and the outer conductor 12 are electrically in contact. In fact the outer and inner conductor at the closed end form a continuous conductor over the end face of the wall of the cylindrical body forming a electrical short 23. The inner and outer conductor extend over the electrically end and following the forming rounded edges of the hollow cylindrical body so that the inner and outer conductor themselves form rounded edges at the electrically closed end of the resonant trap. It appears that these rounded edges enhance the adhesion of the inner and outer conductors to the cylindrical body. This renders the resonant trap less susceptible to damage to the outer and inner conductors. At the opposite end of the trap the resilient ring 14 is clamped in the open end of the axial channel 11. One or several protrusions (or stubs) 21 extend from the resilient ring 14 and carry the tuning capacitor(s) 15. To each protrusion one of the tuning capacitors is soldered. Each tuning capacitor 15 is in electrical contact to the outer conductor 12 by way of the electrically conducting strip 33 that extends from the tuning capacitor 15 to the outer conductor 12 and is soldered to the surface of the outer conductor. The electrically conducting strip is soldered to the outer conductor over a soldering length sd. The length sd is such that it is sufficiently long to achieve adequate adhesion of the electrically conducting strip. In order to avoid thermal stress between the electrically conducting strip and the outer conductor, the soldering length sd is not longer than needed for adequate adhesion.

Tangentially extending isolating slits 16 are provided in the outer conductor in a region near the electrically open end of the resonant trap These slits 16 extend over the cylindrical body and locally interrupt the outer conductor. The resonant frequency of the resonant trap is accurately tuned by way of the length of the slits over the cylindrical body during manufacture of the resonant trap.

In the manufacturing of the resonant trap of FIG. 5, first the resilient ring 14 with its protrusions 21 is clamped into the open end of the axial channel. Then the tuning capacitors 15 are soldered to the protrusions 21. Finally electrical contact of the tuning capacitors 15 to the outer conductor 12 is made by soldering the electrically conducting strip to the tuning capacitor and to the outer conductor. During these soldering processes the resilient ring is clamped in the open end of the axial channel so that during soldering the various components remain in position firmly supported by the resilient ring.

Figure 6:
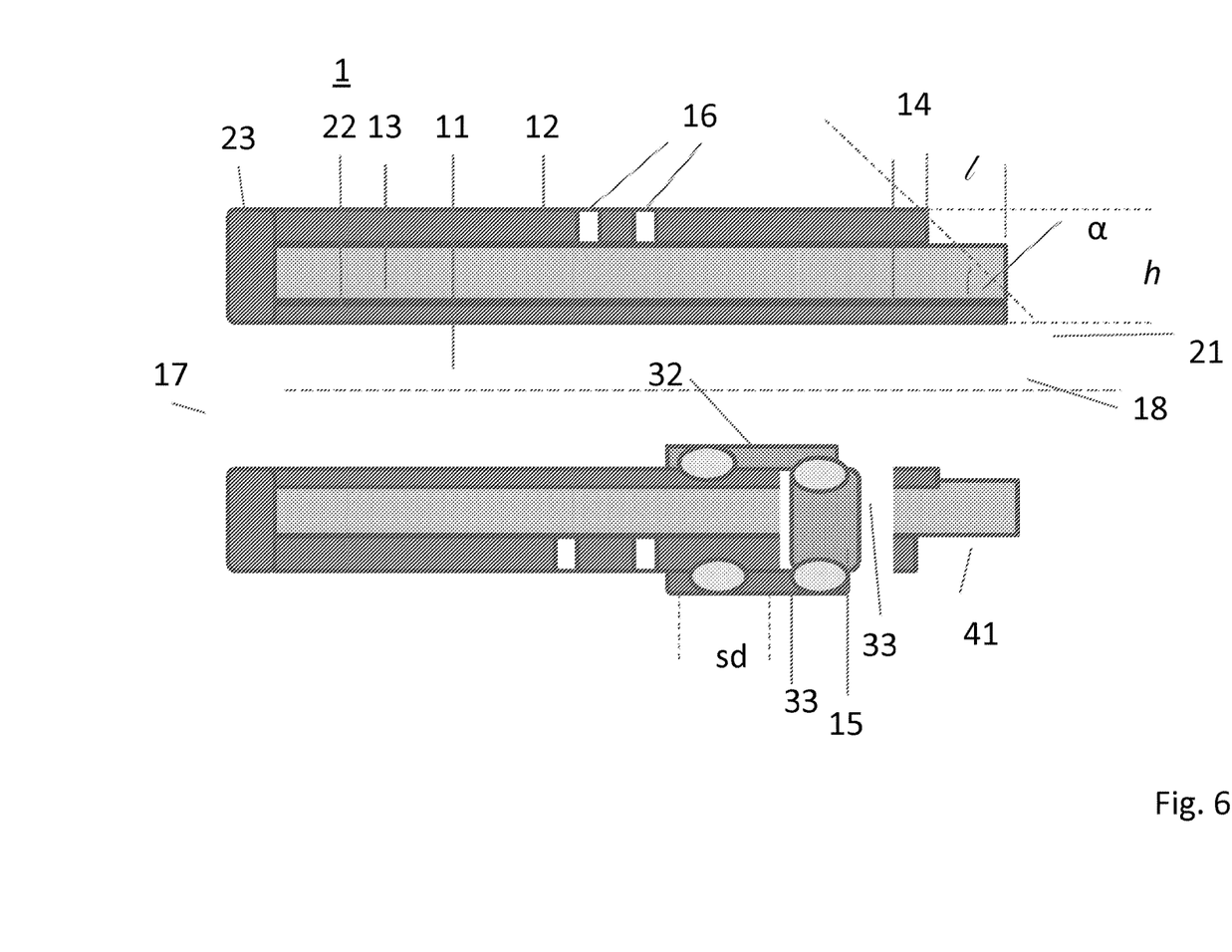

FIG. 6 shows a schematic cross section of the resonant trap of the invention in FIG. 3. The cross section is along a plane parallel to the longitudinal axis 18. The body of the resonant trap is cylindrically symmetric about the longitudinal axis 18 and the interior forms the axial channel 11. The body 13 is made of a ceramic dielectric material. The outer conductor 12 is disposed on the body 13 as metallic plating. The inner conductor 22 is disposed on the inner wall of the body, i.e. on the wall of the axial channel. At the electrically closed end 17 of the trap 1 the inner conductor 22 and the outer conductor 12 are electrically in contact. The tuning capacitor 15 is lodged in the radial recess 33 through the wall of the cylindrical body 13 and the inner 22 and outer 12 conductors, the tuning capacitor 15 is mounted on the axial plate 32. The axial plate is soldered to the inner conductor 22 and provides a firm support for the tuning capacitor. Electrical contact between the tuning capacitor 15 to the outer conductor 12 is established by the electrically conducting strip 33 that is soldered to the tuning capacitor 15 and to the outer conductor 12. The electrically conducting strip is soldered to the outer conductor over a soldering length sd. The length sd is such that it is sufficiently long to achieve adequate adhesion of the electrically conducting strip. In order to avoid thermal stress between the electrically conducting strip and the outer conductor, the soldering length sd is not longer than needed for adequate adhesion.

The tangential isolating slits 16 are provided as discussed with reference to FIG. 5.

Further the electrically isolating zone is provided at the electrically open end 18 of the resonant trap. The isolating zone is formed by disposing the outer conductor 12 not all the way up to the end face of the cylindrical body 13, but leaving the outer surface of ceramic dielectric material of the cylindrical body over the isolating zone not covered by the outer conductor. The isolating zone extends azimuthally all around the cylindrical body 13. Longitudinally the isolating zone extends over a length l=h tan α, where h is the sum of the thickness of the cylindrical body wall and the outer conductor and α is the angle formed by the line extending between the radially inner end of the cylindrical body and the radially outer end of the outer conductor. Good results are achieved when α=45° or slightly larger.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A resonant trap comprising:
    a hollow cylindrical body its interior forming an axial channel, the hollow cylindrical body having an inner wall surface and an outer wall surface;
    an inner conductor disposed on the hollow cylindrical body's inner wall surface;
    an outer conductor disposed on the hollow cylindrical body's outer wall surface;
    a resilient ring clamped in the axial channel at an open end of the axial channel, the resilient ring being attached to the inner wall surface; and
    a tuning capacitor mounted to the resilient ring, the tuning capacitor being connected between the resilient ring and the outer conductor.

2. The resonant trap as claimed in claim 1, wherein the resilient ring includes one or more axially extending protrusions.

3. A resonant trap comprising:
    a hollow cylindrical body its interior forming an axial channel, the hollow cylindrical body having an inner wall facing the axial channel and an outer wall exterior to the axial channel;
    an inner conductor disposed on the inner wall of the hollow cylindrical body;
    an outer conductor disposed on the outer wall of the hollow cylindrical body;
    radial access defined through the outer conductor, the hollow cylindrical body and the inner conductor;
    an axial plate attached to the inner wall near the radial access; and
    a tuning capacitor mounted to the axial plate.

4. A resonant trap comprising:
    a hollow cylindrical body its interior forming an axial channel, an inner conductor is provided on the hollow cylindrical body's inner wall and an outer conductor is provided on the hollow cylindrical body's outer wall,
    a carrier attached to the inner wall of the axial channel, and
    a tuning capacitor mounted to the carrier, the tuning capacitor being electrically connected to the outer conductor by an electrically conducting strip and a length of the electrically conducting strip being a minimum required for a pre-determined adhesion of the electrically conducting strip to the outer conductor.

5. A resonant trap comprising:
    a hollow cylindrical body forming an interior axial channel, an inner conductor is provided on an inner wall of the hollow cylindrical body and an outer conductor is provided on an outer wall of the hollow cylindrical body, wherein the hollow cylindrical body has an electrical open end at which the inner conductor and the outer conductor are electrically separated and an electrically closed end at which the inner and the outer conductor are electrically connected,
    tangentially extending isolating slits defined in the outer conductor in a region near the electrically open end;
    a carrier attached to the inner wall of the hollow cylindrical body, and
    a tuning capacitor mounted to the carrier.

6. The resonant trap as claimed in claim 5, further including:
    an electrically isolating zone provided on the hollow cylindrical body's outer wall and extending between the outer conductor and the electrically open end.

7. A magnetic resonance examination system comprising:
    an auxiliary device electrically connected to the magnetic resonance imaging system by way of a cable or electrical lead that includes a resonant trap, the resonant trap including:
        a hollow cylindrical body forming an inner axial channel,
        an inner conductor provided on an inner, interior wall of the hollow cylindrical body, and
        an outer conductor is provided on an outer, exterior wall of the hollow cylindrical body;
        a carrier attached to the inner wall of the hollow cylindrical body; and
        a tuning capacitor mounted to the carrier.

8. The resonant trap as claimed in claim 7, wherein the inner and outer conductors are formed by a continuous electrically conducting layer extending over an end of the hollow cylindrical body and following the forming rounded edges of the hollow cylindrical body between and shorting the inner and outer conductors.

* * * * *